United States Patent
Yu et al.

(10) Patent No.: US 11,843,044 B2
(45) Date of Patent: Dec. 12, 2023

(54) BIPOLAR TRANSISTOR STRUCTURE ON SEMICONDUCTOR FIN AND METHODS TO FORM SAME

(71) Applicant: GlobalFoundries U.S. Inc., Malta, NY (US)

(72) Inventors: Hong Yu, Clifton Park, NY (US); Alexander M. Derrickson, Saratoga Springs, NY (US); Judson R. Holt, Ballston Lake, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/578,687

(22) Filed: Jan. 19, 2022

(65) Prior Publication Data

US 2023/0098557 A1    Mar. 30, 2023

Related U.S. Application Data

(60) Provisional application No. 63/261,791, filed on Sep. 29, 2021.

(51) Int. Cl.
*H01L 29/735* (2006.01)
*H01L 29/08* (2006.01)
*H01L 29/417* (2006.01)
*H01L 29/66* (2006.01)

(52) U.S. Cl.
CPC ........ *H01L 29/735* (2013.01); *H01L 29/0808* (2013.01); *H01L 29/0821* (2013.01); *H01L 29/41708* (2013.01); *H01L 29/6625* (2013.01)

(58) Field of Classification Search
CPC ............... H01L 29/735; H01L 29/0808; H01L 29/6625; H01L 27/0705; H01L 27/0623; H01L 29/1008; H01L 29/165
See application file for complete search history.

(56) References Cited

U.S. PATENT DOCUMENTS

| | | |
|---|---|---|
| 4,567,645 A | 2/1986 | Cavanagh et al. |
| 6,569,730 B2 | 5/2003 | Tsai et al. |
| 7,485,537 B2 | 2/2009 | Ho et al. |

(Continued)

OTHER PUBLICATIONS

European Search Report for corresponding EP Application No. 22 19 8237 dated Jan. 16, 2023, 10 pages.

(Continued)

*Primary Examiner* — Wasiul Haider
(74) *Attorney, Agent, or Firm* — Francois Pagette; Hoffman Warnick LLC

(57) ABSTRACT

Embodiments of the disclosure provide a bipolar transistor structure on a semiconductor fin. The semiconductor fin may be on a substrate and may have a first doping type, a length in a first direction, and a width in a second direction perpendicular to the first direction. The semiconductor fin includes a first portion and a second portion adjacent the first portion along the length of the semiconductor fin. The second portion is coupled to a base contact. A dopant concentration of the first portion is less than a dopant concentration of the second portion. An emitter/collector (E/C) material is adjacent the first portion along the width of the semiconductor fin. The E/C material has a second doping type opposite the first doping type. The E/C material is coupled to an E/C contact.

20 Claims, 12 Drawing Sheets

(56) References Cited

U.S. PATENT DOCUMENTS

| | | |
|---|---|---|
| 8,258,602 B2 | 9/2012 | Ke |
| 8,703,571 B2 | 4/2014 | Ke et al. |
| 9,209,095 B2 | 12/2015 | Chang et al. |
| 9,514,998 B1 | 12/2016 | Basker et al. |
| 9,673,307 B1 | 6/2017 | Chan |
| 10,217,853 B1* | 2/2019 | Pan .................. H01L 29/41708 |
| 10,468,498 B2 | 11/2019 | Kim et al. |
| 10,741,645 B2 | 8/2020 | Balakrishnan et al. |
| 2011/0147892 A1 | 6/2011 | Chiu et al. |
| 2013/0328162 A1 | 12/2013 | Hu |
| 2014/0367745 A1 | 12/2014 | Cheng et al. |
| 2015/0287650 A1 | 10/2015 | Chang et al. |
| 2017/0062564 A1 | 3/2017 | Zhou |
| 2018/0269289 A1 | 9/2018 | Balakrishnan et al. |
| 2019/0312126 A1* | 10/2019 | Shiu .................. H01L 29/66318 |
| 2021/0091180 A1 | 3/2021 | Pekarik et al. |
| 2021/0193836 A1 | 6/2021 | Guha et al. |
| 2021/0296309 A1* | 9/2021 | Chang ................ H01L 21/8249 |
| 2023/0098557 A1 | 3/2023 | Yu et al. |

OTHER PUBLICATIONS

"Bipolar Transistor Structure on Semiconductor Fin and Methods to Form Same," U.S. Appl. No. 17/644,939, filed Dec. 17, 2021, 40 pages.

U.S. Appl. No. 17/644,939, Response to Restriction Requirement dated May 22, 2023, 7 pages.

U.S. Appl. No. 17/644,939, Response to Office Action dated Jun. 29, 2023, 13 pages.

U.S. Appl. No. 63/239,135, filed Aug. 31, 2021, 31 pages.

U.S. Appl. No. 17/644,939, Application filed Dec. 17, 2021, 145 pages.

U.S. Appl. No. 17/644,939, Restriction Requirement dated May 12, 2023, 6 pages.

U.S. Appl. No. 17/644,939, Response to Restriction Requirement filed Dec. 17, 2021, 7 pages.

U.S. Appl. No. 17/644,939, Office Action dated Jun. 20, 2023, 29 pages.

U.S. Appl. No. 17/644,939, Amendment to Office Action filed Jun. 29, 2023, 13 pages.

U.S. Appl. No. 17/578,687, Office Action dated Mar. 16, 2023, 23 pages.

U.S. Appl. No. 17/578,687, Response to Office Action filed Jun. 16, 2023, 9 pages.

U.S. Appl. No. 17/578,687, Notice of Allowance dated Jul. 11, 2023, 9 pages.

U.S. Appl. No. 63/239,135, Provisional Application filed Aug. 31, 2021, 31 pages.

U.S. Appl. No. 63/261,791, Provisional Application filed Sep. 29, 2021, 47 pages.

U.S. Appl. No. 17/644,939 Final Office Action dated Aug. 25, 2023, 25 pages.

* cited by examiner

BIPOLAR TRANSISTOR STRUCTURE ON SEMICONDUCTOR FIN AND METHODS TO FORM SAME

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs and/or operational parameters that do not meet certain constraints. Improving the electrical behavior of a bipolar transistor may provide related improvements in a device. Some bipolar transistors, such as lateral bipolar transistors, may require significant process accommodations to be integrated into desired locations of a device structure. Such process accommodations may include, e.g., doping and shaping of semiconductor regions in different ways depending on the nature of the device(s) to be formed. Integrating bipolar transistors into a structure with various kinds of FETs may present technical challenges if the different kinds of transistors require distinct types of processing.

SUMMARY

The illustrative aspects of the present disclosure are designed to solve the problems herein described and/or other problems not discussed.

Embodiments of the disclosure provide a bipolar transistor structure including: a semiconductor fin on a substrate, the semiconductor fin having a first doping type, a length in a first direction, and a width in a second direction perpendicular to the first direction, wherein the semiconductor fin includes: a first portion; a second portion coupled to a base contact and adjacent the first portion along the length of the semiconductor fin, wherein a dopant concentration of the first portion is less than a dopant concentration of the second portion, and an emitter/collector (E/C) material adjacent the first portion along the width of the semiconductor fin, the E/C material having a second doping type opposite the first doping type, wherein the E/C material is coupled to an E/C contact.

Additional embodiments of the disclosure provide a bipolar transistor structure including: a semiconductor fin on a substrate, the semiconductor fin having a first doping type, a length in a first direction, and a width in a second direction perpendicular to the first direction, wherein the semiconductor fin includes: an intrinsic base region having a first dopant concentration, and an extrinsic base region adjacent the intrinsic base region along the length of the semiconductor fin and having a second dopant concentration greater than the first dopant concentration; an emitter/collector (E/C) material adjacent the intrinsic base region along the width of the semiconductor fin, the E/C material having a second doping type opposite the first doping type; a base contact to the extrinsic base region; and an E/C contact to the E/C material, wherein the E/C contact is distal to the base contact along the length of the semiconductor fin.

Further embodiments of the disclosure provide a method of forming a bipolar transistor structure, the method including: forming a semiconductor fin on a substrate, the semiconductor fin having a first doping type, a length in a first direction, and a width in a second direction perpendicular to the first direction, wherein the semiconductor fin includes: a first portion; a second portion coupled to a base contact and adjacent the first portion along the length of the semiconductor fin, wherein a dopant concentration of the first portion is less than a dopant concentration of the second portion; and forming an emitter/collector (E/C) material adjacent the first portion along the width of the semiconductor fin, the E/C material having a second doping type opposite the first doping type, wherein the E/C material is coupled to an E/C contact.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
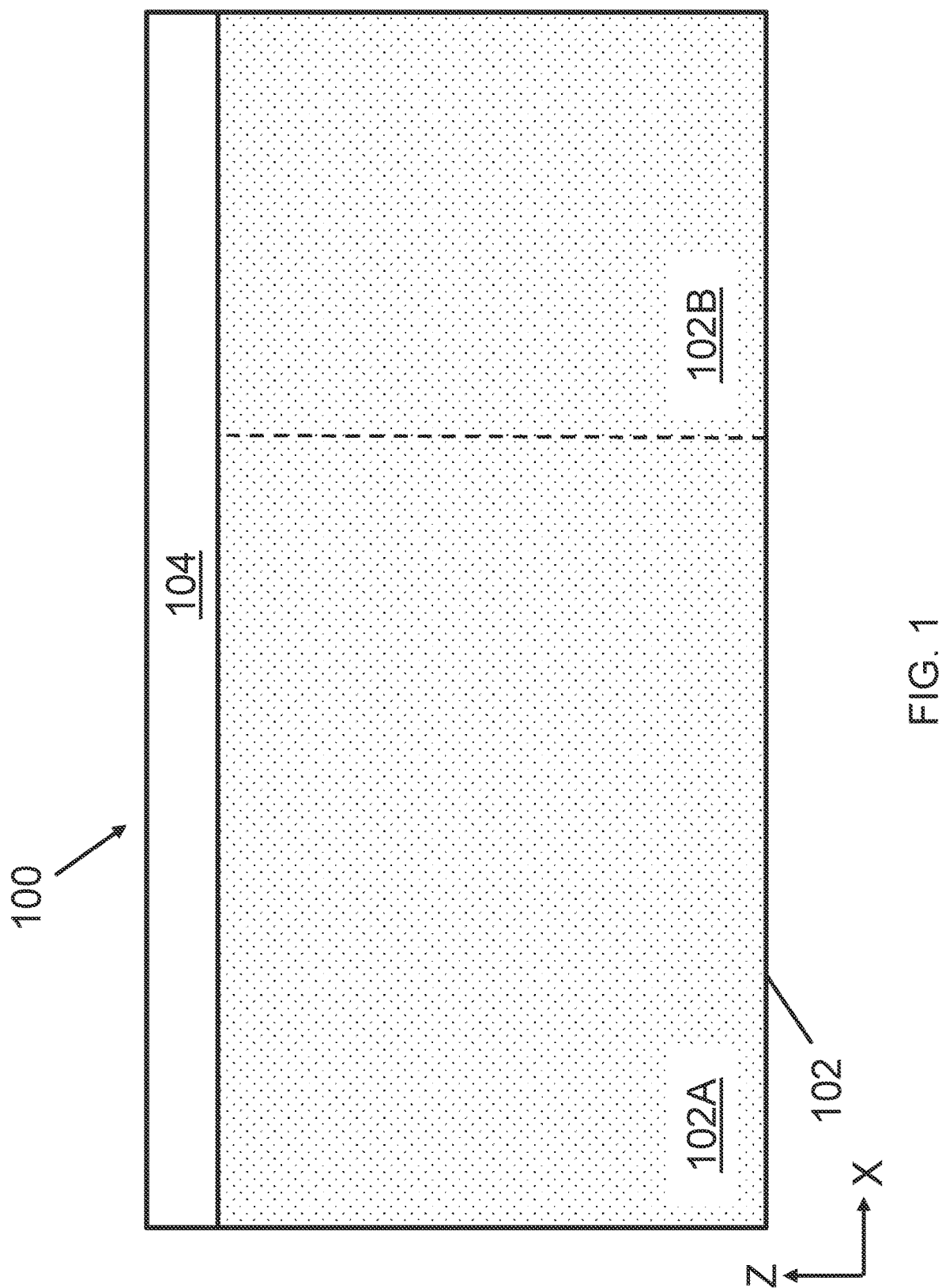
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor structure formed on a semiconductor fin, e.g., for integration with conventional fin-type field effect transistors (FinFETs) and/or other devices formed on similar substrate material(s). A bipolar transistor structure according to the disclosure may include a semiconductor fin on a substrate. The semiconductor fin may have a first doping type such as P-type or N-type doping. The semiconductor fin has a length extending in a first direction and a width extending in a second direction perpendicular to the first direction. The semiconductor fin may have a first portion (e.g., extrinsic base region) coupled to a base contact. A second portion of the semiconductor fin may be adjacent the first portion along a length of the semiconductor fin. The second portion may be less highly doped than the first portion and thus may define an intrinsic base region of the semiconductor fin. An emitter/collector (E/C) material may be on a sidewall of the semiconductor fin, e.g., along a width of the semiconductor fin. The E/C material may be of opposite doping type relative to the semiconductor fin (e.g., N-type when the semiconductor fin is doped P-type or vice versa). The E/C material may be coupled to an E/C contact to define emitter and collector terminals alongside the semiconductor fin.

Other fins on the same substrate may be processed differently, e.g., to define FinFET transistors or other complementary metal oxide semiconductor (CMOS) devices.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the physical interface between the two semiconductor materials.

Referring to FIG. 1, a preliminary structure 100 (simply "structure" hereafter) suitable to form a bipolar transistor structure according to embodiments of the disclosure is shown. Preliminary structure 100 may be processed as described herein to yield one or more bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. Substrate 102 may be subdivided into, e.g., a bipolar transistor site 102A and a complementary metal oxide (CMOS) site 102B targeted for the forming of different types of devices. Sites 102A, 102B may be structurally indistinguishable from each other within substrate 102, and the boundary between sites 102A, 102B of substrate 102 may be arbitrary. A dotted line is shown between sites 102A, 102B to indicate locations where different devices are implemented.

Structure 100 may include embedded elements for electrically separating active materials formed over substrate 102 from other regions and/or materials. An insulator layer 104 optionally may be formed over sites 102A, 102B of substrate 102, e.g., by forming a layer of dielectric material (e.g., oxide or nitride insulative material), converting silicon material within substrate 102 into a higher-resistive material such as polycrystalline or amorphous silicon (poly-Si), or other techniques. As examples, insulator layer 104 may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 2:
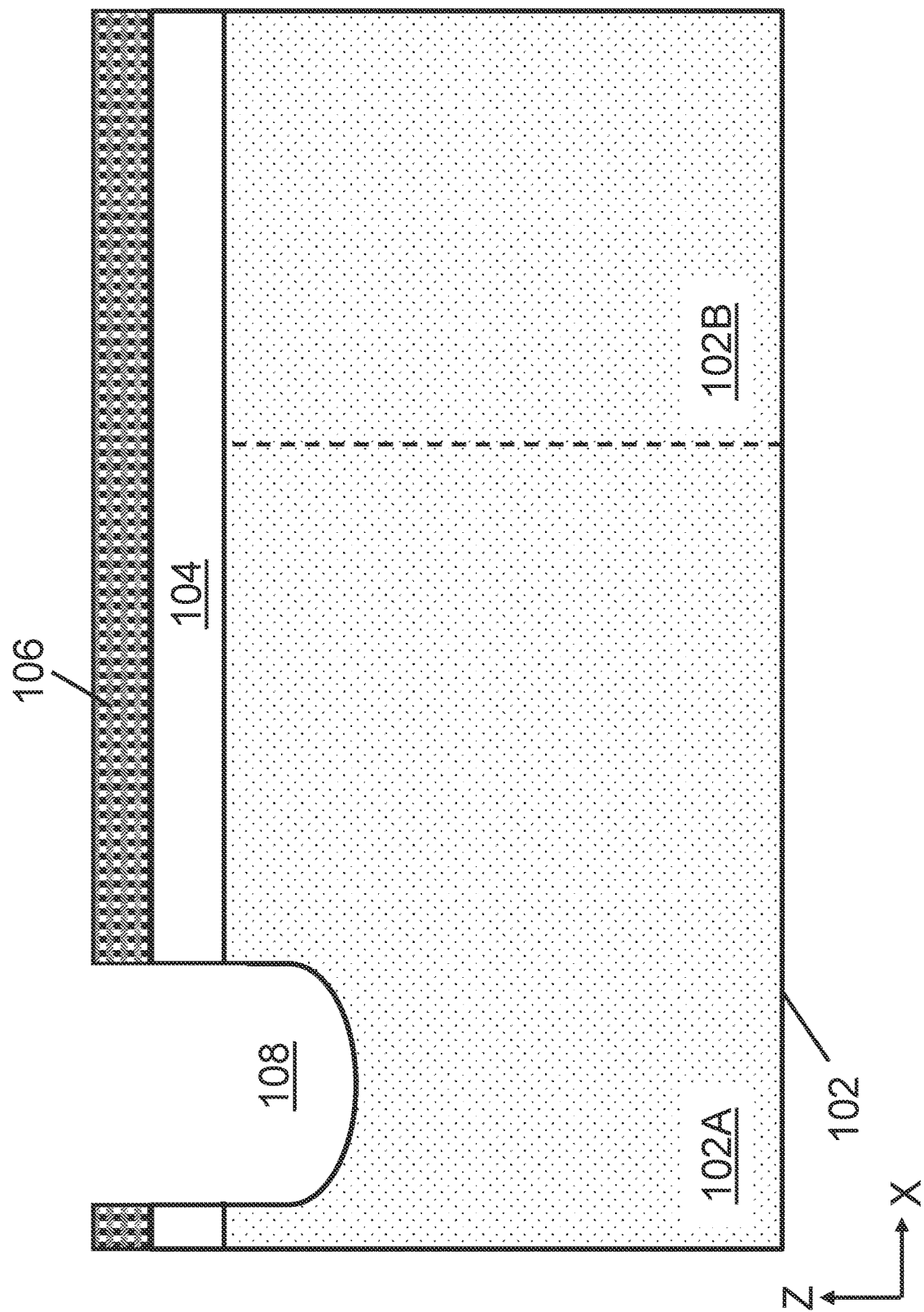
FIG. 2 depicts a cross-sectional view of forming an opening in a bipolar transistor site of a substrate according to embodiments of the disclosure.

Turning to FIG. 2 embodiments of the disclosure may include removing portions of substrate 102 (e.g., at bipolar transistor site 102A) and insulative layer 104 using a mask 106 to form an opening 108 within substrate 102. This removal process may include, for example, mask 106 patterned to expose selected portion(s) of substrate 102 and/or insulator layer 104. Mask 106 may include any now known or later developed appropriate masking material, e.g., a nitride hard mask. As shown in FIG. 2, any appropriate etching process, e.g., reactive ion etching (RIE), can remove a portion of insulative layer 104 to expose substrate 102. Continued removal (e.g., via etching) may also remove portions of bipolar transistor site 102A to a predetermined depth to define opening 108 therein. As discussed herein, forming opening 108 allows semiconductor fins of varying doping polarity to be formed in other processes.

Figure 3:
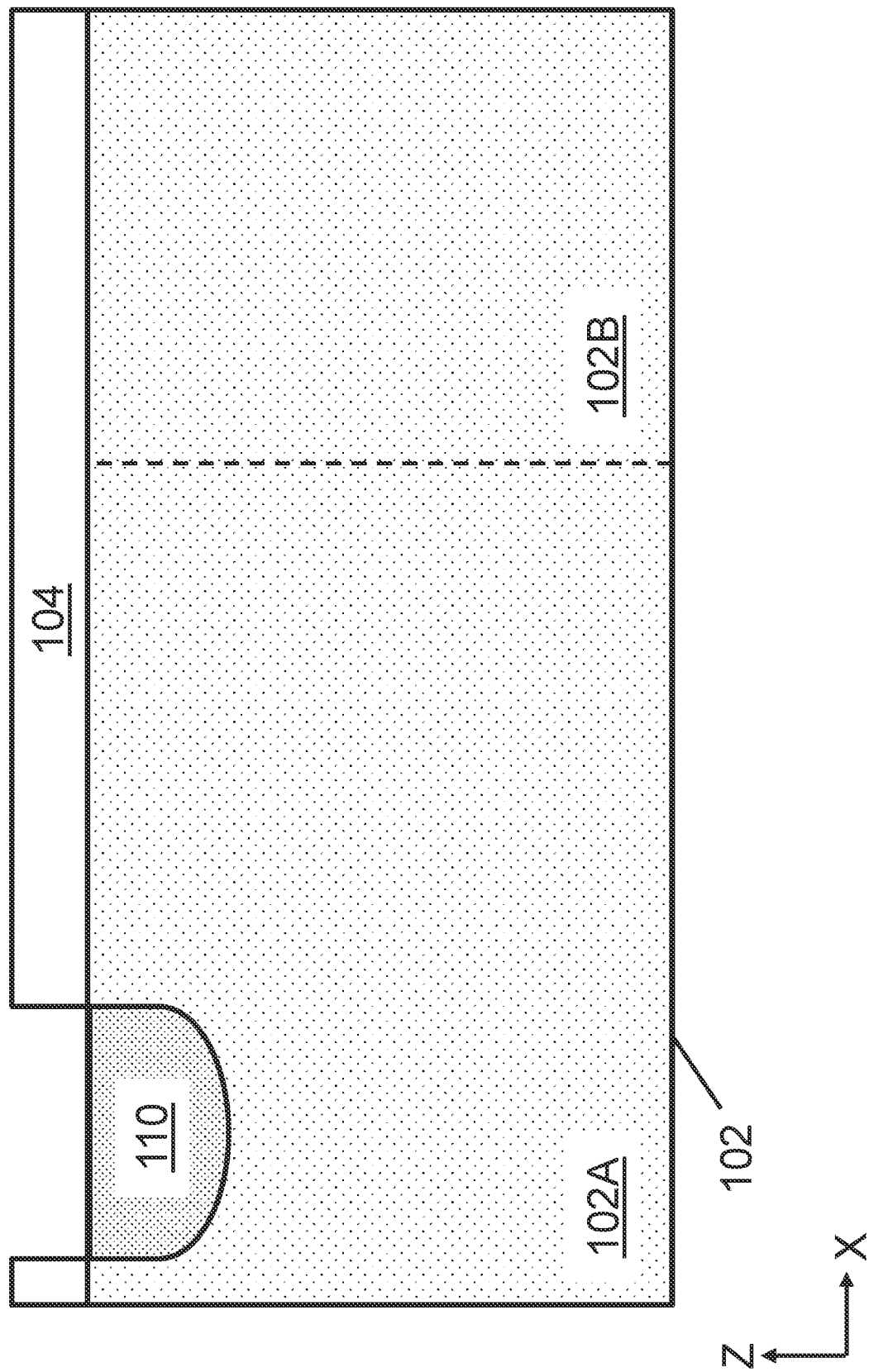
FIG. 3 depicts a cross-sectional view filling the opening with doped substrate material according to embodiments of the disclosure.

FIG. 3 depicts removing mask 106 (FIG. 2) and forming a doped semiconductor layer 110 within substrate 102, e.g., by any currently known or later developed process to introduce dopant into a semiconductor material. For example, additional semiconductor material may be formed (e.g., by deposition) on substrate 102 within opening 108 to form doped semiconductor layer 110. Doped semiconductor layer 110 thus may include any currently known or later developed semiconductor material (e.g., any of those described herein regarding substrate 102) and dopants of any plurality and to any desired concentration. Doped semiconductor layer 110 thus may have a predetermined doping type, e.g., by being doped in-situ or during formation of doped semiconductor layer 110. In some cases, substrate 102 may include bulk silicon while doped semiconductor layer 110 may include silicon germanium (SiGe). According to an example, substrate 102 may be undoped or only lightly doped, while doped semiconductor layer 110 may be more highly doped, for example, P type, to provide active semiconductor material for use in the base terminal of an eventual bipolar transistor structure. In another embodiment layer 110 could be formed via ion implantation.

In some cases, doped semiconductor layer 110 may have a non-uniform doping concentration, e.g., in which lower portions of doped semiconductor layer 110 are less highly doped than upper portions of doped semiconductor layer 110. The non-uniform doping profile may be formed, e.g., by forming doped semiconductor layer 110 as a plurality of individual layers each having a different dopant concentration. In other cases, the non-uniform doping profile may be formed by allowing dopants to diffuse from upper portions of doped semiconductor layer 110 into lower portions of doped semiconductor layer 110.

Figure 4:
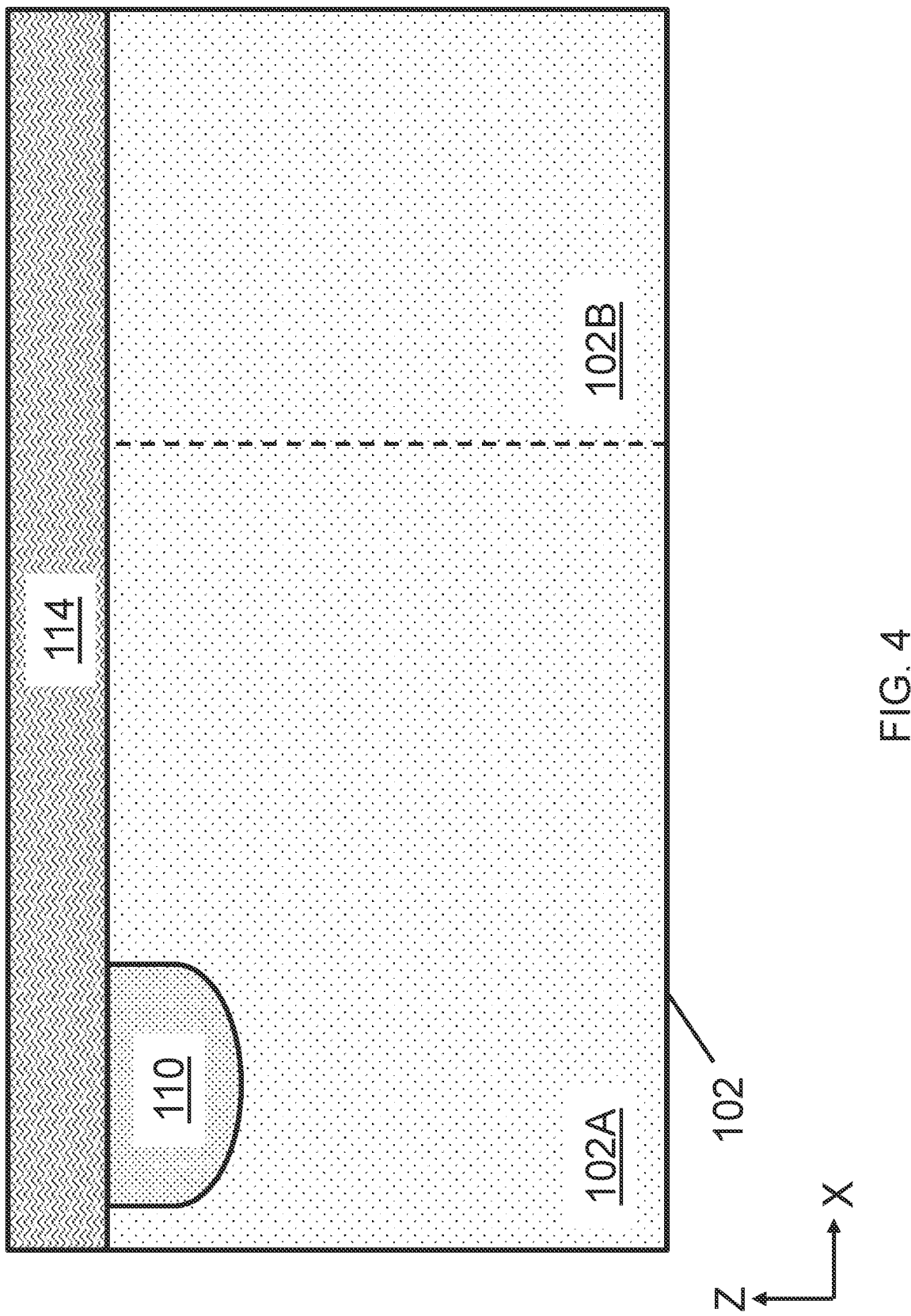
FIG. 4 depicts a cross-sectional view of forming a pad insulator according to embodiments of the disclosure.

Turning to FIG. 4, forming doped semiconductor layer 110 may include removing insulator layer 104 (FIGS. 1-3). Here, embodiments of the disclosure may include forming a pad insulator 114 on substrate 102 and doped semiconductor layer 110. Pad insulator 114 may have the same composition as insulator layer 104 or may include other insulative materials. As an example, pad insulator 114 may include a pad nitride material (e.g., silicon nitride (SiN)). The thickness of pad insulator 114 over substrate 102 and doped semiconductor layer 110 can be user defined, e.g., to affect subsequent processing. In some cases, it may be preferable to form pad insulator 114 with at least the same thickness as doped semiconductor layer 110 to prevent epitaxial overgrowth when emitter and/or collector materials are formed in subsequent processing. Although pad insulator 114 is shown in other FIGS. and discussed elsewhere herein, it is understood that insulator layer 104 may remain intact and be used in further implementations without significantly departing from the technical processes discussed herein. An optional mechanical polishing step may be implemented such that the upper surface of doped semiconductor layer 110 is substantially coplanar with the upper surface of substrate 102.

Figure 5:
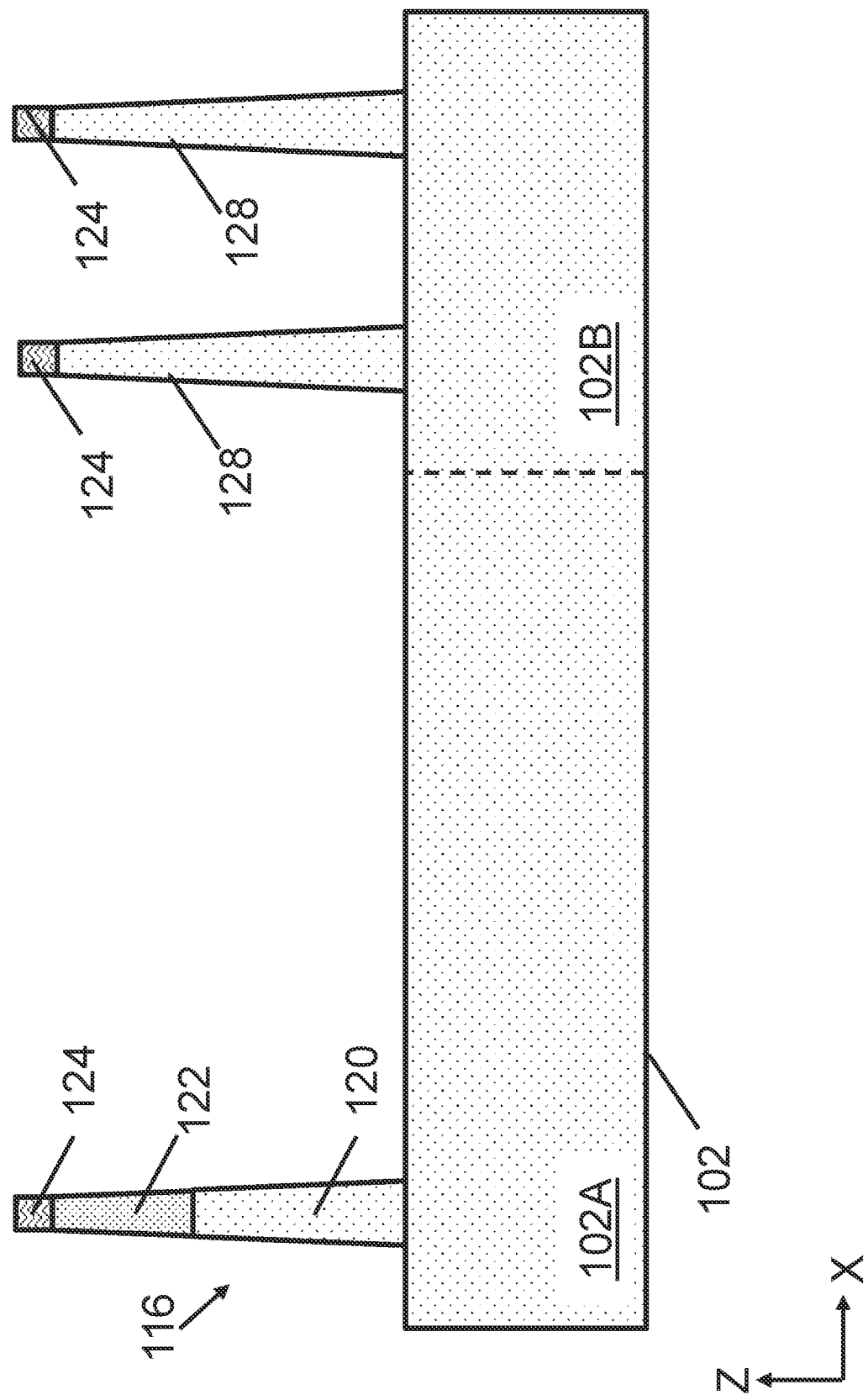
FIG. 5 depicts a cross-sectional view of forming a set of semiconductor fins according to embodiments of the disclosure.

FIG. 5 depicts further processing of the structure to form several semiconductor fins by removing selected portions of substrate 102 material to a predetermined depth. A mask (not shown) or similar material may be formed over pad insulator 114 at selected locations, and non-covered portions of substrate 102, doped semiconductor layers 110 and pad insulator 114 may be removed (e.g., by etching such as RIE) to a predetermined depth and/or over a predetermined interval. Portions of semiconductor material may remain intact as freestanding structures on and above substrate 102, e.g., due to the prior masking and/or non-etching of materials in selected locations. Removing portions of substrate 102, doped semiconductor layer 110, and pad insulator 114 may form a semiconductor fin 116 over bipolar transistor site 102A.

Semiconductor fin 116 may include a lower portion 120 having a first doping polarity and concentration, and an upper portion 122 having the same doping polarity but a higher doping concentration than lower portion 120. In cases where doped semiconductor layer 110 (FIGS. 3, 4) has a non-uniform dopant concentration, that concentration may be highest within upper portion 122 and lowest within lower portion 120 of semiconductor fin 116. In the eventual bipolar transistor structure, upper portion 122 may be subdivided intrinsic and extrinsic base regions for a bipolar transistor, while lower portion 120 may have a sufficiently low dopant concentration as to be electrically inactive. An insulative cap 124 may be on upper portion 122 of semiconductor fin 116, e.g., to physically and electrically separate subsequently formed emitter and collector terminals of a bipolar transistor. Other portions of a bipolar transistor may be formed on, and/or may be coupled to, semiconductor fin 116 in other processing phases.

The forming of semiconductor fin 116 optionally may also produce a set of additional semiconductor fins 128 on CMOS site 102B of substrate 102. Additional semiconductor fins 128, moreover, may also include insulative cap(s) 124 thereon. Further processing may modify semiconductor fin 116 on bipolar transistor site 102A differently from additional semiconductor fins 128 on CMOS site 120B.

Figure 6:
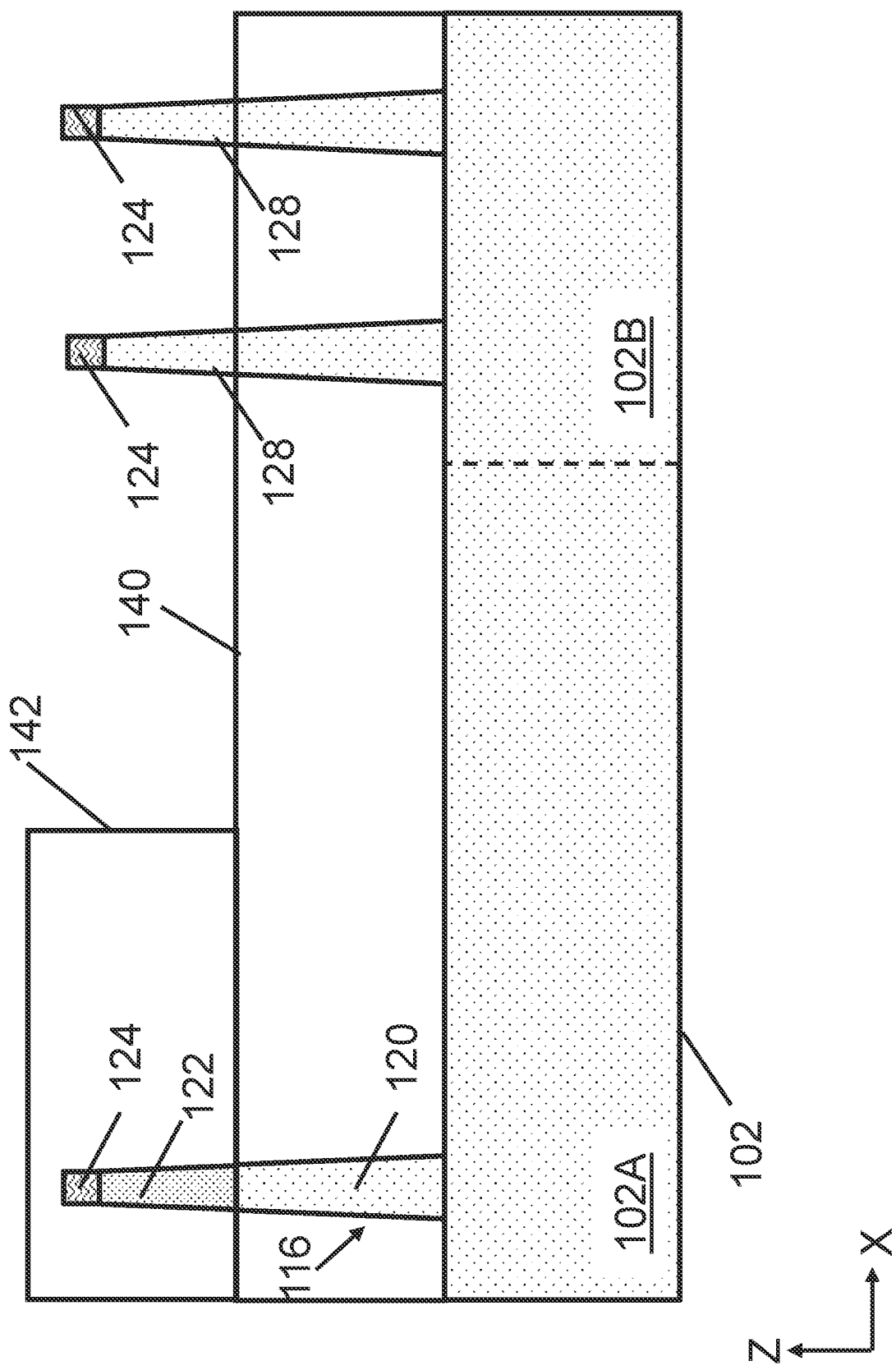
FIG. 6 depicts a cross-sectional view of targeting CMOS semiconductor fins for processing according to embodiments of the disclosure.
Figure 7:
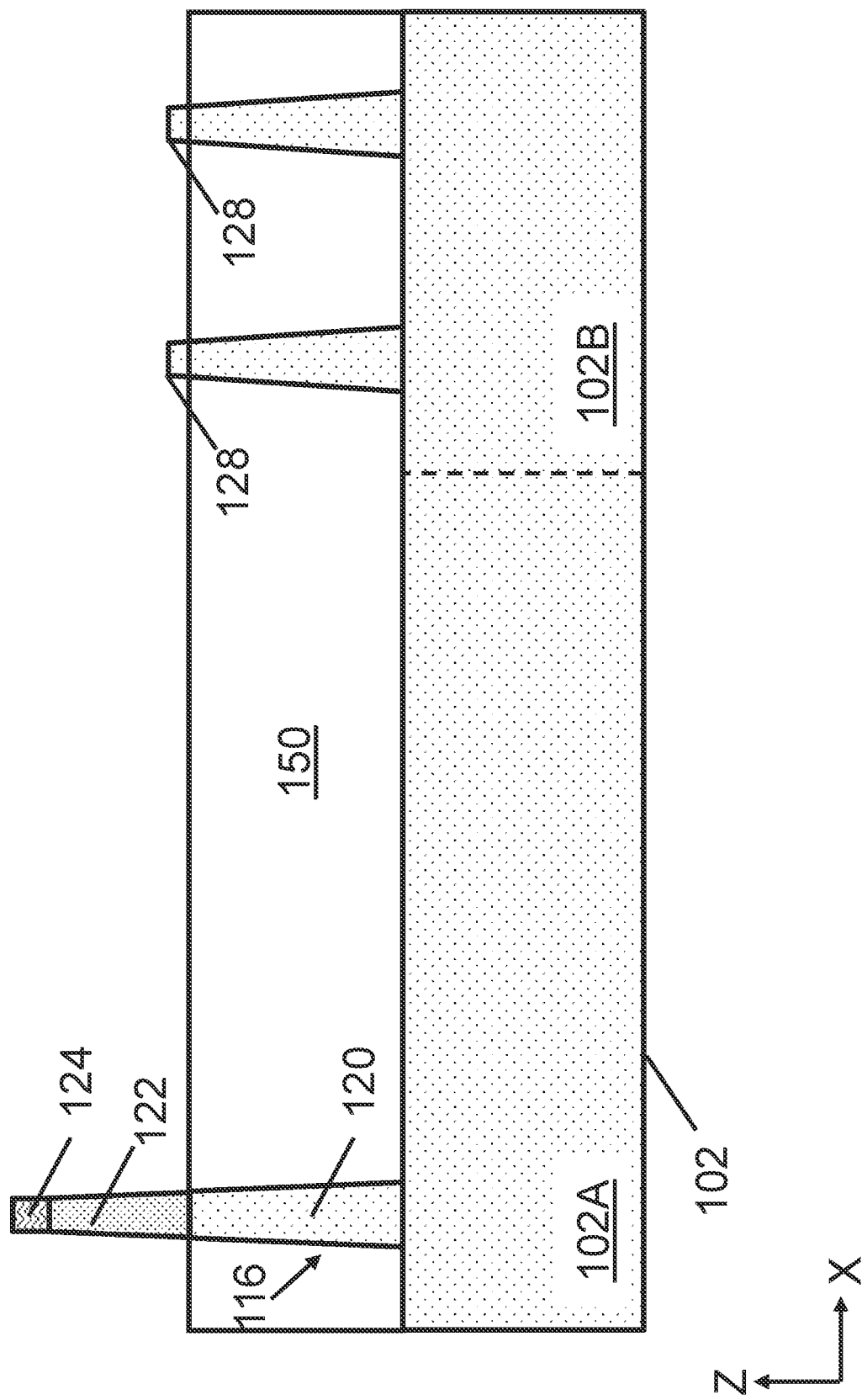
FIG. 7 depicts a cross-sectional view of removing the pad insulator from bipolar semiconductor fins according to embodiments of the disclosure.

FIGS. 6 and 7 depict, in cases where additional semiconductor fins 128 are on CMOS site 102B, processing of additional semiconductor fins 128 without affecting semiconductor fin 116 on bipolar transistor site 102A. As shown in FIG. 6, a first overlying insulator 140 may be formed adjacent semiconductor fin 116 and additional semiconductor fins 128 to a desired height and a second overlying insulator 142 may be formed solely over semiconductor fin 116 without covering additional semiconductor fins 128. First overlying insulator 140 and second overlying insulator 142 each may include any currently known or later developed insulative material, e.g., any of those discussed herein concerning insulator layer 104, insulative caps 124, and/or other similar materials.

Second overlying insulator 142 may be provided, e.g., to mask semiconductor fin 116 and adjacent portions of first overlying insulator 140 while modifying additional semiconductor fins 128. Overlying insulators 140, 142 can be created by any currently known or later developed process to form additional insulative material only over selected areas (e.g., sites 102A, 102B of substrate 102). As shown in FIG. 7, portions of additional semiconductor fins 128 and insulative cap(s) 124 thereover may be recessed (e.g., by silicon etch) such that additional semiconductor fins 128 have a reduced height as compared with semiconductor fin 116. The recessing of additional semiconductor fins 128 may be implemented, e.g., to prepare additional semiconductor fins 128 for gate metal formation and/or metal gate replacement in conventional FinFET processing. Such recessing also may be implemented, e.g., after forming a "dummy gate" order to produce a recessed source/drain structure. In some cases, overlying insulators 140, 142 may be embodied as a single layer of varying vertical thicknesses (e.g., it may be thicker bipolar transistor site 102A than over CMOS site 102B).

Referring specifically to FIG. 7, continued processing may include removing and/or recessing second overlying insulator 142 such that the remaining insulative material (e.g., first overlying insulator 140) has a uniform height above substrate 102. The resulting region of insulative material may define a trench isolation (TI) region 150 for electrically isolating multiple structures (e.g., semiconductor fins 116, 128) and components formed thereon from each other. After being formed, TI region 150 may have a substantially uniform height above substrate 102. In some cases, upper portion 122 of semiconductor fin 116 may be above TI 150, though this is not necessarily required. In alternative implementations, some portions of TI region 150 above substrate 102 may horizontally abut upper portion 122 of semiconductor fin 116.

Figure 8:
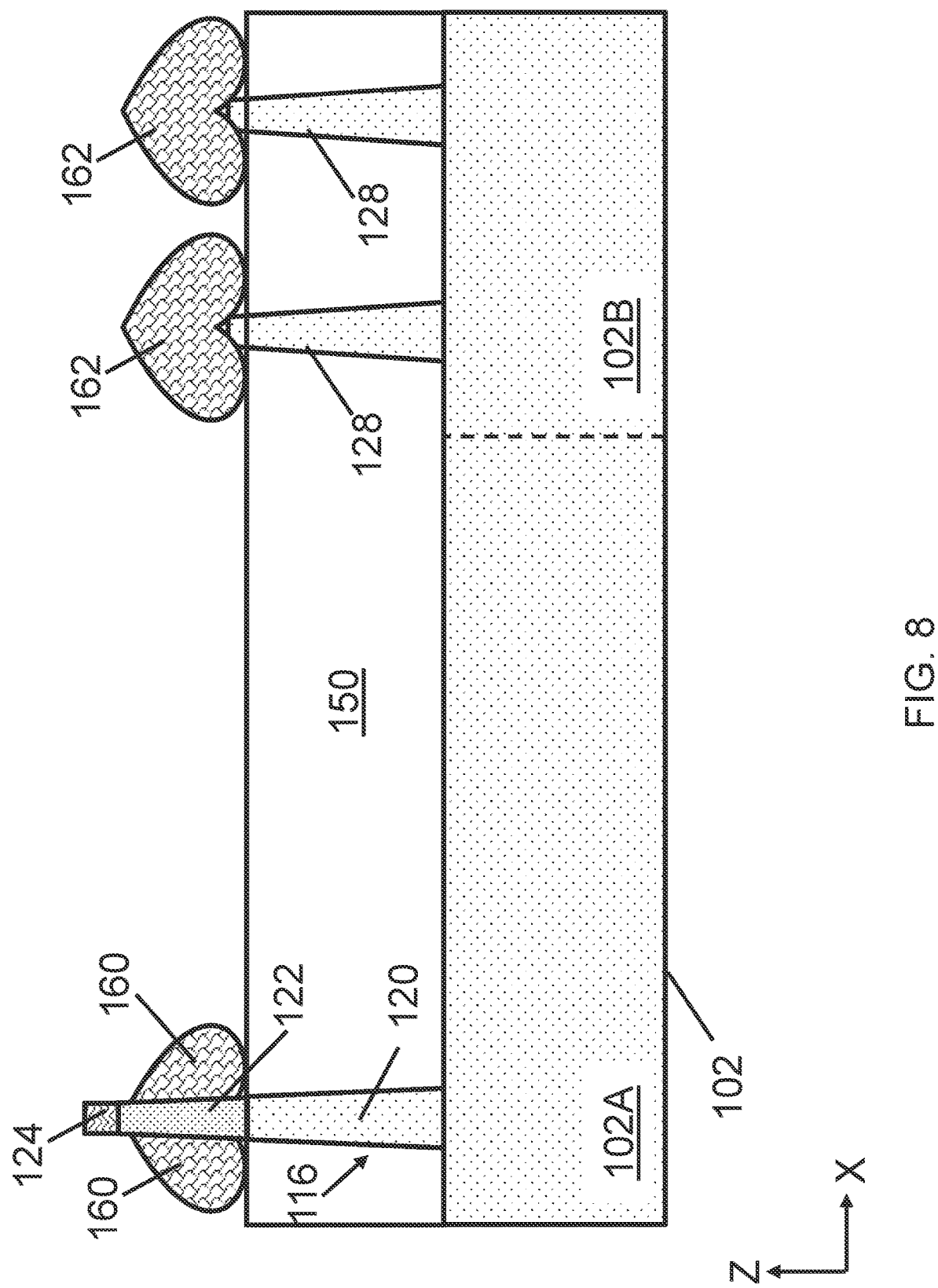
FIG. 8 depicts a cross-sectional view of forming an E/C material and doped semiconductor material on the semiconductor fins according to embodiments of the disclosure.

Turning to FIG. 8, further processing may include forming an emitter/collector (E/C) material 160 on semiconductor fin 116, e.g., on exposed surfaces of upper portion 122. E/C material 160 may define all or part of the active bipolar transistor materials for emitter and collector terminals of a bipolar transistor structure. E/C material 160 may be formed on respective portions (e.g., sidewalls) of semiconductor fin 116, e.g., by epitaxial growth or deposition of doped semiconductor material. E/C material 160 may include the same material composition as semiconductor fin 116 (e.g., doped silicon phosphide (SiP)), but with an opposite doping type (e.g., they may be doped N type when upper portion 122 is doped P type or vice versa). E/C material 160 additionally or alternatively may include other electrically active semiconductor materials. E/C material 160 may be formed to a desired size, in part due to structural support by TI region 150 thereunder. As shown, a lower surface of E/C material 160 may rest upon an upper surface of TI region 150. In the case where E/C material 160 is formed by epitaxial growth, some portions of E/C material 160 may laterally abut portions of insulative cap 124. In this case, insulative cap 124 may prevent E/C material 160 on one side of semiconductor fin 116 from touching and being electrically coupled to E/C material 160 on another side of semiconductor fin 116.

The forming of E/C material 160 may be implemented together (e.g., simultaneously) with the forming source/drain (S/D) material 162 on additional semiconductor fins 128 over CMOS site 102B. S/D material 162 may include the same material and/or similar material(s) to E/C material 160 (e.g., SiP or other doped semiconductor(s)) to form an electrical coupling to active material within additional semiconductor fins 128. S/D material 162 may be formed, e.g., by epitaxial growth of doped material on exposed surfaces of additional semiconductor fins 128. By being formed on additional semiconductor fins 128 over CMOS site 102B, S/D material 162 can be structurally separate (e.g., horizontally distal to) any active material(s) located over bipolar transistor site 102A. Further active components to additional semiconductor fin(s) 128 (e.g., gate contacts thereto) may be formed in different areas (e.g., cross-sectional planes) from those shown in FIG. 9 according to conventional processing.

Figure 9:
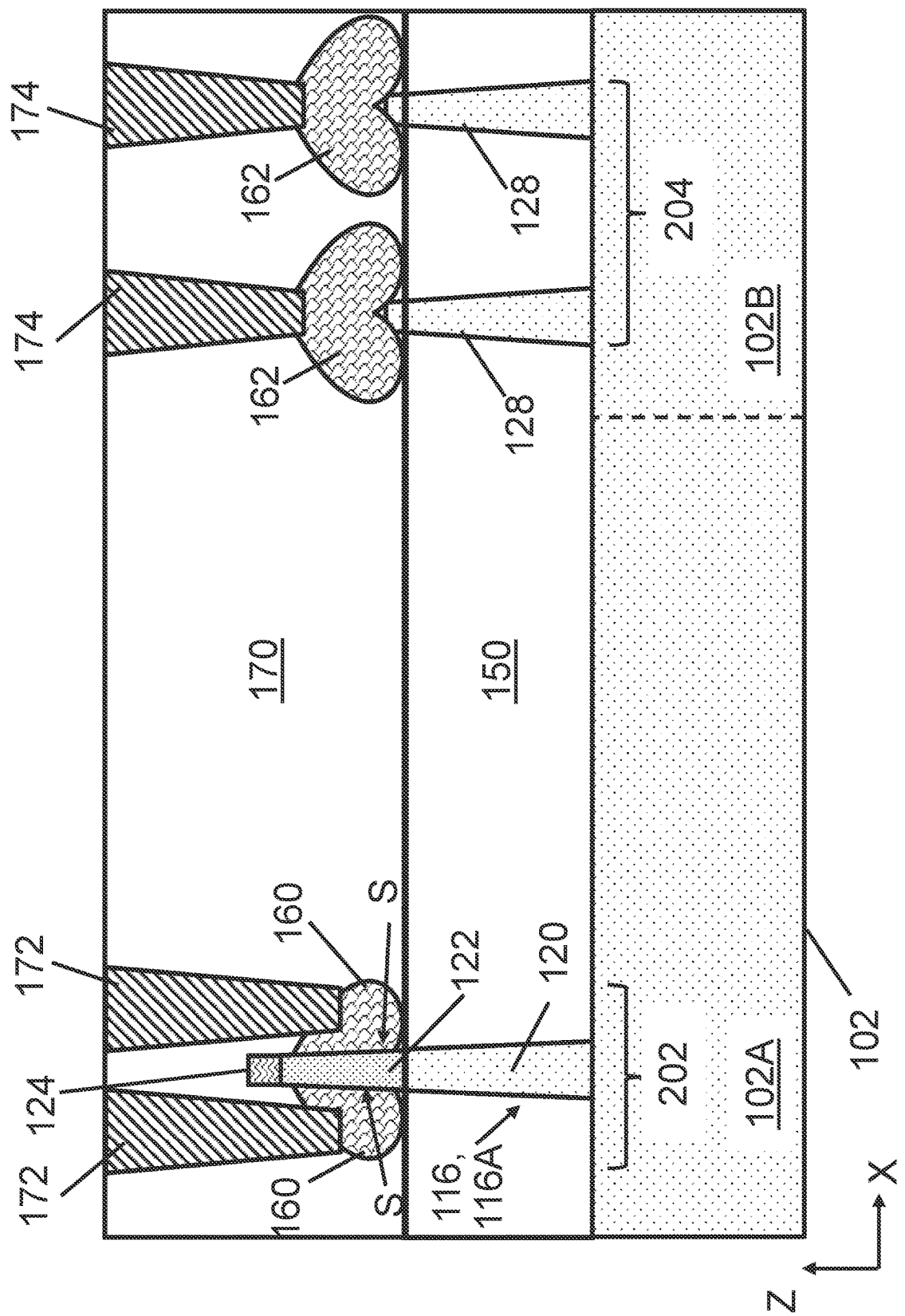
FIG. 9 depicts a first cross-sectional of a bipolar transistor structure on a semiconductor fin according to embodiments of the disclosure.

FIG. 9 depicts forming an inter-level dielectric (ILD) layer 170 over TI 150 and semiconductor fins 116, 128 by deposition or other techniques of forming an insulative material on a structure. The portion of semiconductor fin 116 shown in the cross-sectional view of FIG. 9 is a first portion 116A to be processed differently from other portions of semiconductor fin 116 discussed herein. Additional metallization layers (not shown) may be formed on ILD layer 170 in subsequent processing during middle-of-line and/or back-end-of-line processing. ILD layer 170 may include any currently known or later developed insulative layer, e.g., those included within insulative cap(s) 124 and/or TI 150. Despite ILD layer 170 possibly having a similar or identical composition to such materials, it is formed separately from other insulative material and boundaries and/or physical interfaces between ILD layer 170 and other such materials may be present in the structure. To electrically couple E/C material 160 to overlying layers and/or structures, a set of E/C contacts 172 may be formed to E/C material 160 and within ILD layer 170. E/C contact(s) 172 may include any currently known or later developed material to form a conductive electrical pathway, e.g., tungsten (W), copper (Cu), aluminum (Al), etc. E/C contacts 172 may additionally include refractory metal liners (not shown) positioned alongside ILD layer 170 to prevent electromigration degradation, shorting to other components, etc. Conductive material also may be formed to S/D material 162 within ILD 170 to form S/D contacts 174 for use in a FinFET device. S/D contacts 174 may include the same conductive materials as E/C contact(s) 172, and in some cases contacts 172, 174 may be formed simultaneously via a single deposition of conductive metal(s). Some portions of E/C material 160 may include silicide regions (i.e., portions of semiconductor that are annealed in the presence of an overlying conductor) to increase the electrical conductivity at their physical interface with contact(s) 172, where applicable.

Figure 10:
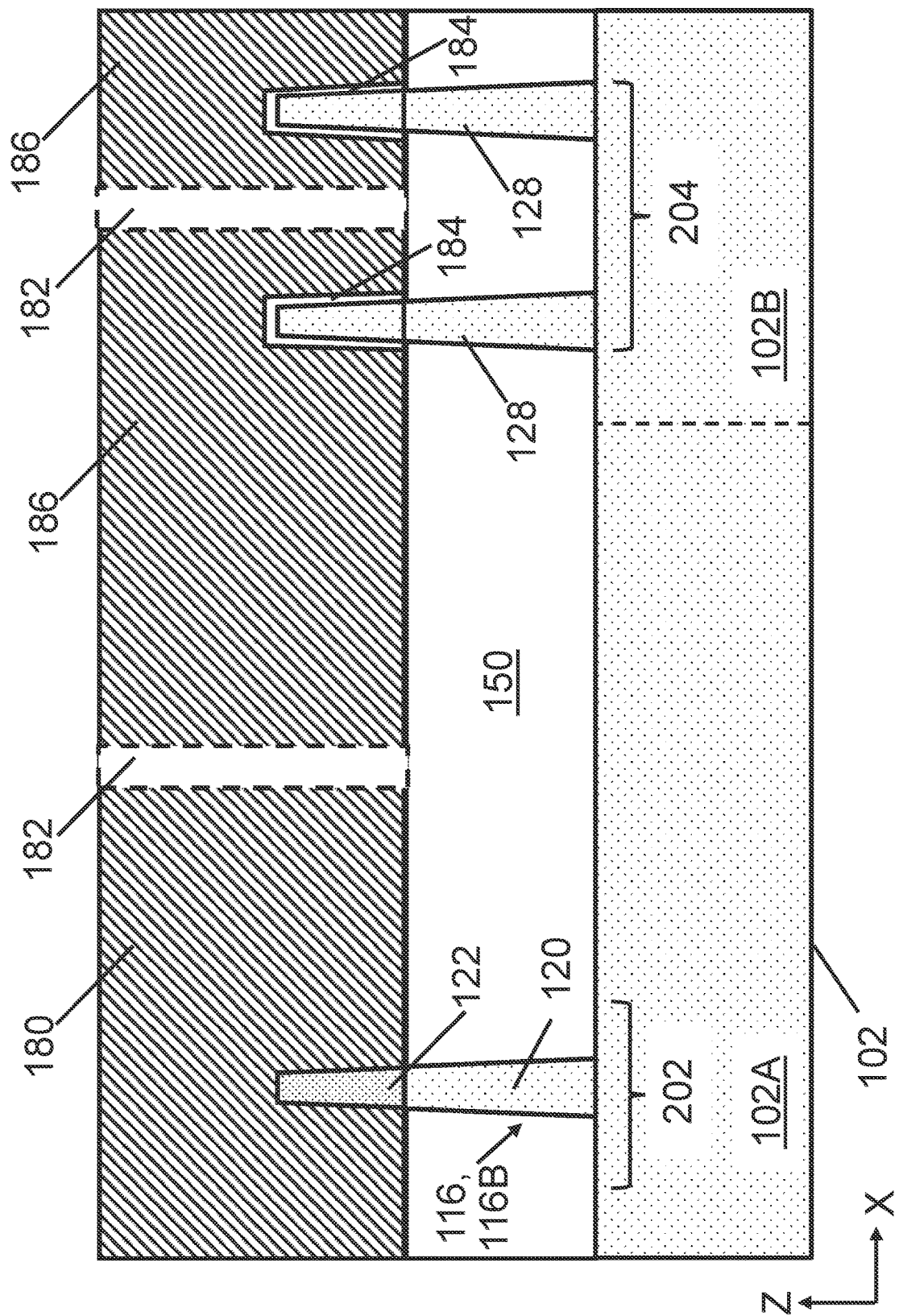
FIG. 10 depicts a second cross-sectional of a bipolar transistor structure on a semiconductor fin according to embodiments of the disclosure.
Figure 11:
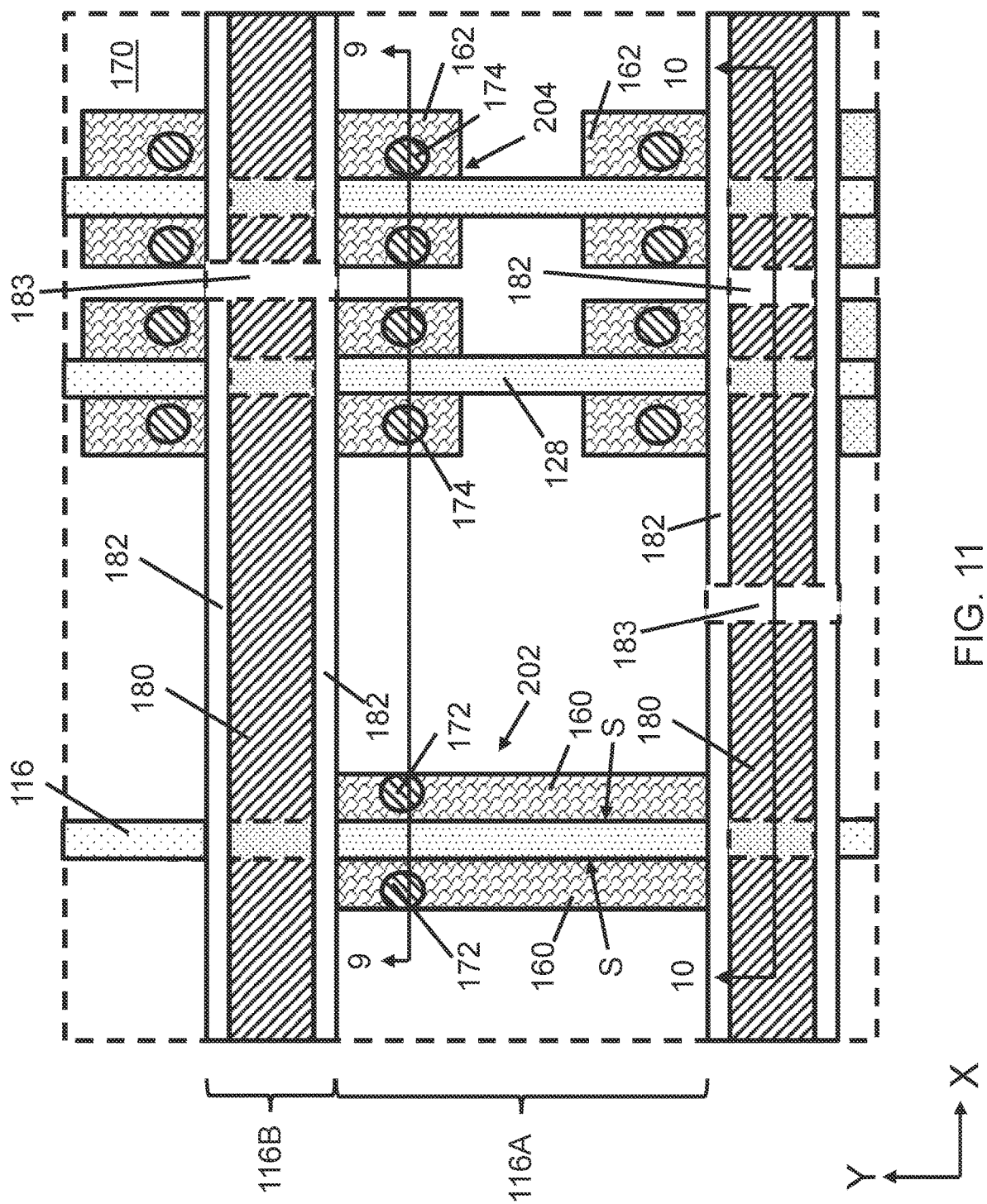
FIG. 11 depicts a plan view of a bipolar transistor structure according to embodiments of the disclosure.

Referring to FIGS. 10 and 11 together, additional electrically active components of a bipolar transistor may be formed elsewhere on semiconductor fin 116, e.g., out of the plane depicted in FIG. 9. FIG. 10 depicts a cross-sectional view along view line 10-10 of the plan view of FIG. 11. In FIGS. 10 and 11, a second portion 116B of semiconductor fin 116 is processed to form the base terminal of a bipolar transistor, which may include, for instance, additional ion implantation or epitaxial growth steps (not pictured). The cross-sectional view in FIG. 10 may be, e.g., a trench structured for deposition of gate conductor materials for a FinFET transistor over CMOS site 102B. A base contact 180 to second portion 116B of semiconductor fin 116 may be formed, e.g., by removing ILD 170 to form an opening (e.g., a trench as shown in FIG. 10) and filling the opening with conductive material(s). Base contact 180 may include any material(s) discussed herein regarding E/C contact(s) 172, including silicide material (not shown), and moreover may include refractory metal liners adjacent ILD layer 170, e.g., outside the plane of the cross-section shown in FIG. 10. Areas of semiconductor fin 116 located beneath base contact 180 are shown in phantom in FIG. 11.

Optionally, a set of insulative barriers 182, 183 (shown in phantom lines) may be formed by removing portions of base contact 180 and replacing such portions with insulative material, and/or otherwise forming insulative material(s) to create barrier(s) 182 alongside base contact 180 or barrier(s) 183 within base contact 180 for electrical isolation. As shown in FIG. 11, some insulative barriers 182 may take the form of spacers extending along a length of base contact 180, e.g., at respective sidewalls thereof. Other insulative barriers 183 may replace portions of base contact 180 to subdivide one conductive area into multiple conductive areas. Insulative barriers 182, 183 may include the same material(s) as ILD layer(s) 170 and/or may include other insulative materials. Insulative barriers 182, 183 may be created simply by cutting an initial gate structure (e.g., dummy gate) before metal gate replacement (also known as "replacement metal gate" (RMG) processing). This may cause the bipolar and CMOS areas to be physically separated before ILD layer 170 deposition.

A technical benefit to forming base contact 180 within a trench over second portion 116B (e.g., as shown in FIG. 180) is that conductive material(s) to other structures of substrate 102 may be formed elsewhere in the same trench. For instance, embodiments of the disclosure may include forming a gate dielectric layer 184 on additional semiconductor fin(s) 128 over CMOS site 102B. One or more gate conductors 186 can be formed above additional semiconductor fin(s) 128 and on gate dielectric layer 184, e.g., to provide conductive material for controlling FinFET transistors of CMOS site 102B. Insulative barriers 182, in this case, may electrically separate base contact 180 from gate conductors 186. In this configuration, base contact 180 and gate conductor(s) 186 may be formed by depositing a single conductive layer and thereafter forming insulative barrier(s) 182 to separate the conductive layer into distinct base contacts 180 and gate conductors 186. In further configurations, e.g., as shown in FIG. 11, base contact 180 may be coupled to FinFET device 204 as well as bipolar transistor structure 202 without insulative barrier(s) 182 to allow simultaneous electrical coupling to bipolar transistor structure 202 and FinFET device 204.

Referring to FIGS. 9-11 together, embodiments of the disclosure provide a bipolar transistor structure 202 in which active material of a bipolar transistor is defined within at least semiconductor fin 116. In bipolar transistor structure 202, emitter and collector terminals may be defined on or within semiconductor fin 116 (e.g., at first portion 116A), while a base terminal may be defined elsewhere within semiconductor fin (e.g., at second portion 116B). Portions 116A, 116B of semiconductor fin 116 may be adjacent to each other along a length of semiconductor fin 116 (e.g., the direction of the Y axis in FIG. 11), while E/C material 160 may be adjacent semiconductor fin 116 along a width of semiconductor fin 116 (e.g., the direction of the X axis).

E/C material 160 may have a second doping type that is opposite the doping type of semiconductor fin 116 (e.g., N-type doping). Multiple regions of E/C material 160 can be formed on respective sidewalls S of semiconductor fin 116, e.g., such that first portion 116A of semiconductor fin 116 may be horizontally between two layers of E/C material 160. The doping of semiconductor fin 116 discussed herein allows current flow to second portion 116B from base contact to enable or disable current flow between regions of E/C material 160 through first portion 116A. In this configuration, first portion 116A may be an intrinsic base region that is less highly doped than the adjacent second portion 116B. Second portion 116B, in this case, may function as an extrinsic base region of bipolar transistor structure 202. Insulative cap 124 optionally may be on first portion 116A of semiconductor fin 116 to prevent electrical shorting between multiple regions of E/C material 160. Insulative cap 124 may not be in second portion 116B, however, to provide additional surface area for coupling to base contact 180. TI region 150 may be on substrate, such that a lower surface of E/C material 160 rests on TI 150. Additionally, one or more fin-type field effect transistor (FinFET) devices 204 may be on substrate 102 over CMOS site 102b without being electrically coupled to bipolar transistor structure 202.

Advantages of the disclosure include the ability to provide bipolar transistor structure 202 and FinFET devices 204 on one substrate 102 (e.g., at different sites 102a, 102b thereof). In addition to reducing the surface area required to form multiple types of transistors, embodiments of the disclosure allow various FinFET processing techniques to be used to form bipolar transistor structure 202. Embodiments of the disclosure allow continued use of highly doped extrinsic base material by forming such material in portions 116A, 116B of semiconductor fin 116, e.g., to define intrinsic and extrinsic base regions and/or to define a coupling between semiconductor fin 116 to base contact 180. Bipolar transistor structure(s) 202 may be operationally identical to other bipolar transistor structures, and moreover may provide a smaller horizontal width than conventional bipolar transistor structures.

Figure 12:
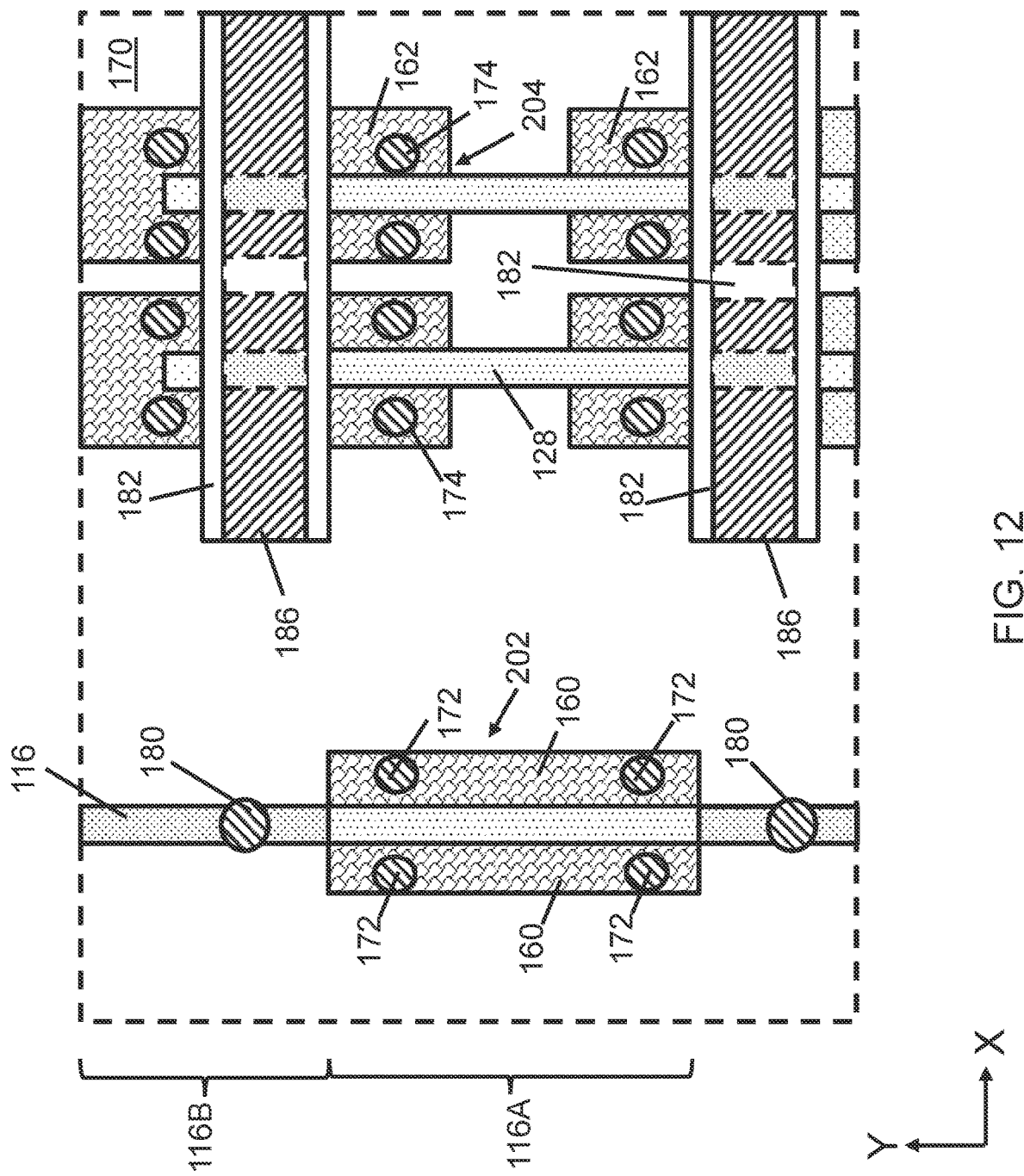
FIG. 12 depicts a plan view of a bipolar transistor structure according to further embodiments of the disclosure.

Referring to FIG. 12, further implementations of bipolar transistor structure 202 may provide base contact 180 as a separate structure or material from gate conductor 186. Here, base contact 180 may be formed as a single conductive region within ILD 170 without having a same length and/or geometrical profile as gate conductor 186 in CMOS site 102B. In such cases, base contact 180 may be substantially aligned with second portion 116B of semiconductor fin 116 to provide an electrical coupling to the more highly doped material within semiconductor fin 116. Despite this structural variation, bipolar transistor structure 202 may operate substantially identically to other embodiments discussed herein.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure comprising:
   a semiconductor fin on a substrate, the semiconductor fin having a first doping type, a length in a first direction, and a width in a second direction perpendicular to the first direction, wherein the semiconductor fin includes:
      a first portion, and
      a second portion coupled to a base contact and adjacent the first portion along the length of the semiconductor fin, wherein a dopant concentration of the first portion is less than a dopant concentration of the second portion;
   an insulative cap on the first portion of the semiconductor fin, wherein the second portion of the semiconductor fin does not include the insulative cap thereon; and
   an emitter/collector (E/C) material adjacent the first portion along the width of the semiconductor fin, the E/C material having a second doping type opposite the first doping type, wherein the E/C material is coupled to an E/C contact.

2. The bipolar transistor structure of claim 1, wherein the base contact includes a conductor within a trench, and wherein the second portion of the semiconductor fin is within the trench.

3. The bipolar transistor structure of claim 1, wherein the base contact is on an upper surface of the second portion of the semiconductor fin.

4. The bipolar transistor structure of claim 1, wherein the E/C material includes a first E/C layer on a first sidewall of the semiconductor fin, and a second E/C layer on a second sidewall of the semiconductor fin, wherein the insulative cap is horizontally between the first E/C layer and the second E/C layer along the width of the semiconductor fin.

5. The bipolar transistor structure of claim 1, further comprising a trench isolation (TI) in the substrate and adjacent a lower portion of the semiconductor fin, wherein the E/C material is over the TI.

6. The bipolar transistor structure of claim 1, wherein the semiconductor fin includes silicon germanium (SiGe), and the E/C material includes silicon phosphide (SiP).

7. The bipolar transistor structure of claim 1, further comprising a fin-type field effect transistor (FinFET) device on the substrate and horizontally distal to the semiconductor fin, wherein the base contact is also coupled to the FinFET device.

8. The bipolar transistor structure of claim 7, further comprising an insulative barrier within the base contact between the semiconductor fin and the FinFET device.

9. A bipolar transistor structure comprising:
   a semiconductor fin on a substrate, the semiconductor fin having a first doping type, a length in a first direction, and a width in a second direction perpendicular to the first direction, wherein the semiconductor fin includes:
      an intrinsic base region having a first dopant concentration,
      an insulative cap on the intrinsic base region of the semiconductor fin and extending across the width of the semiconductor fin, and
      an extrinsic base region adjacent the intrinsic base region along the length of the semiconductor fin and having a second dopant concentration greater than the first dopant concentration;
   an emitter/collector (E/C) material adjacent the intrinsic base region along the width of the semiconductor fin, the E/C material having a second doping type opposite the first doping type;
   a base contact to the extrinsic base region; and
   an E/C contact to the E/C material, wherein the E/C contact is distal to the base contact along the length of the semiconductor fin.

10. The bipolar transistor structure of claim 9, wherein the second dopant concentration is a non-uniform dopant concentration that is highest within an upper portion of the semiconductor fin and lowest within a lower portion of the semiconductor fin.

11. The bipolar transistor structure of claim 9, wherein the extrinsic base region of the semiconductor fin does not include the insulative cap thereon.

12. The bipolar transistor structure of claim 9, wherein the E/C material includes a first E/C layer on a first sidewall of the semiconductor fin, and a second E/C layer on a second sidewall of the semiconductor fin, wherein the insulative cap is horizontally between the first E/C layer and the second E/C layer along the width of the semiconductor fin.

13. The bipolar transistor structure of claim 9, wherein the semiconductor fin includes silicon germanium (SiGe), and the E/C material includes silicon phosphide (SiP).

14. The bipolar transistor structure of claim 9, further comprising a fin-type field effect transistor (FinFET) device on the substrate and horizontally distal to the semiconductor fin.

15. The bipolar transistor structure of claim 14, wherein the base contact is also coupled to the FinFET device.

16. A method of forming a bipolar transistor structure, the method comprising:
- forming a semiconductor fin on a substrate, the semiconductor fin having a first doping type, a length in a first direction, and a width in a second direction perpendicular to the first direction, wherein the semiconductor fin includes:
  - a first portion;
  - a second portion coupled to a base contact and adjacent the first portion along the length of the semiconductor fin, wherein a dopant concentration of the first portion is less than a dopant concentration of the second portion;
- forming an insulative cap on the first portion of the semiconductor fin, without forming wherein the insulative cap on the second portion of the semiconductor fin; and
- forming an emitter/collector (E/C) material adjacent the first portion along the width of the semiconductor fin, the E/C material having a second doping type opposite the first doping type, wherein the E/C material is coupled to an E/C contact.

17. The method of claim 16, further comprising forming the base contact as a gate conductor within a trench, and wherein the second portion of the semiconductor fin is within the trench.

18. The method of claim 16, wherein forming the E/C material includes forming a first E/C layer on a first sidewall of the semiconductor fin and forming a second E/C layer on a second sidewall of the semiconductor fin, wherein the insulative cap is horizontally between the first E/C layer and the second E/C layer along the width of the semiconductor fin.

19. The method of claim 16, further comprising forming a trench isolation (TI) in the substrate and adjacent a lower portion of the semiconductor fin, wherein forming the E/C material causes the E/C material to be over the TI.

20. The method of claim 16, wherein the semiconductor fin includes silicon germanium (SiGe), and the E/C material includes silicon phosphide (SiP).

* * * * *